COMPONENT-LEAD STRAIGHTENING MACHINERY

Filed Dec. 3, 1956 3 Sheets-Sheet 1

INVENTORS
ROBERT J. FRANK
LOUIS BURKE
BY
Carl H. Synnestvedt
AGENT

INVENTORS
ROBERT J. FRANK
LOUIS BURKE
BY
Carl H. [signature]
AGENT

INVENTORS
ROBERT J. FRANK
LOUIS BURKE
BY
Carl H. Symmestvedt
AGENT 2,860,686

COMPONENT-LEAD STRAIGHTENING MACHINERY

Robert J. Frank, Horsham, and Louis Burke, Perkasie, Pa., assignors to Philco Corporation, Philadelphia, Pa., a corporation of Pennsylvania Application December 3, 1956, Serial No. 625,992

12 Claims. (Cl. 153—32)

The invention herein described and claimed relates generally to component preparation machinery and pertains particularly to apparatus for straightening wire leads of electrical components to prepare them for subsequent processing in so-called automation equipment adapted for automatic assembly of electronic devices. More specifically, the invention has to do with a machine to effect straightening and alignment of wire leads of axial lead components, such as resistors, capacitors, coils and the like.

Generally, components of the above mentioned kind are provided with elongated leads which are made of slender pliable wire and protrude from opposite ends of cylindrical bodies. These leads become distorted and misaligned particularly when the components are handled in bulk. Components with distorted and misaligned leads are a constant source of difficulties and problems in assembling electronic devices, especially when the assembly is carried out with automation equipment which cuts and forms component leads and which automatically associates components with prefabricated circuit panels. In an effort to overcome these difficulties and problems, manufacturers and suppliers of components have been exercising extreme care in packaging and shipping components. However, even this careful handling does not protect against distortion and misalignment of leads when the components are manipulated by persons employed in the production of electronic devices, so that ways and means must still be provided to straighten and align component leads prior to their use in automation equipment.

Various types of mechanical means have been devised for that purpose, some utilizing instrumentalities which exert a longitudinal pull on the leads, others utilizing instrumentalities which impose lateral pressure on the leads. While lead straightening means of these generally known types are satisfactory to rectify ordinary lead offsets, they oftentimes are ineffective to remove, in one operation, the frequently encountered more severe deformations and misalignments, such as sharp kinks or bends, unless the leads are subjected to a considerable pulling or pressing forces which are likely to result in damage to the components by developing undue stresses therein.

It is therefore an object of the present invention to provide an improved machine which, during a single passage of components therethrough, insures straightening and realignment of wire leads, including those having the more pronounced deformations.

It is also an object of the invention to provide a machine whereby component leads are straightened and aligned by combined functions of associated means which cooperate in a novel manner to smooth out offset lead portions in progressive fashion from the body of the components toward the free ends of the leads so as not to subject components to undue stresses.

A characteristic feature of the invention resides in the provision of a lead straightening machine in which component bodies are positively driven to effect rotation of the leads so that their circumferential surface areas are successively presented for direct contact with instrumentalities functioning to straighten the leads without injury thereto.

The invention is further characterized by the fact that as components are mechanically carried through the machine, all portions of the leads are positively subjected to rapidly repeated pressing and gentle hammering actions thereby insuring elimination of the sharper kinks or bends along the length of the leads without deleteriously affecting the roundness thereof.

The invention, in its broader aspect, realizes the above-noted objects and features by utilizing means for carrying components through the machine, and means for imparting rotational motion to the components in order to bring the leads in correct positions to be straightened.

According to a preferred embodiment, individual components are carried through the machine by operation of a carriage structure associated with anvil members which support the leads while the component body is supported by an idling element. The components are caused to rotate by bringing them individually into a position in which the body of each component is snugly sandwiched between the idling roller and a fixed element which is adapted to bear frictionally on the component body and to cause the component to rotate in the carriage structure as the latter advances the component through the machine. Restoration of bent and misaligned leads to straight and aligned condition, including elimination of the more pronounced kinks and bends, is accomplished through hammer members which undergo vibrational movements to apply rapid gentle blows to different successive surface portions of component leads rolling on the supporting anvil members as components are caused to rotate in the carriage structure. Also in accordance with a specific embodiment of the invention, the surface areas of the hammer members are constructed and disposed with respect to the anvil members to act on successive longitudinal portions of the leads so as to produce an ironing or smoothing effect which contributes to the proper straightening of the leads without damage thereto.

The full nature of the invention and the manner in which its objects and features are achieved will be fully understood from the following description taken in conjunction with the accompanying drawings in which.

Figure 3:
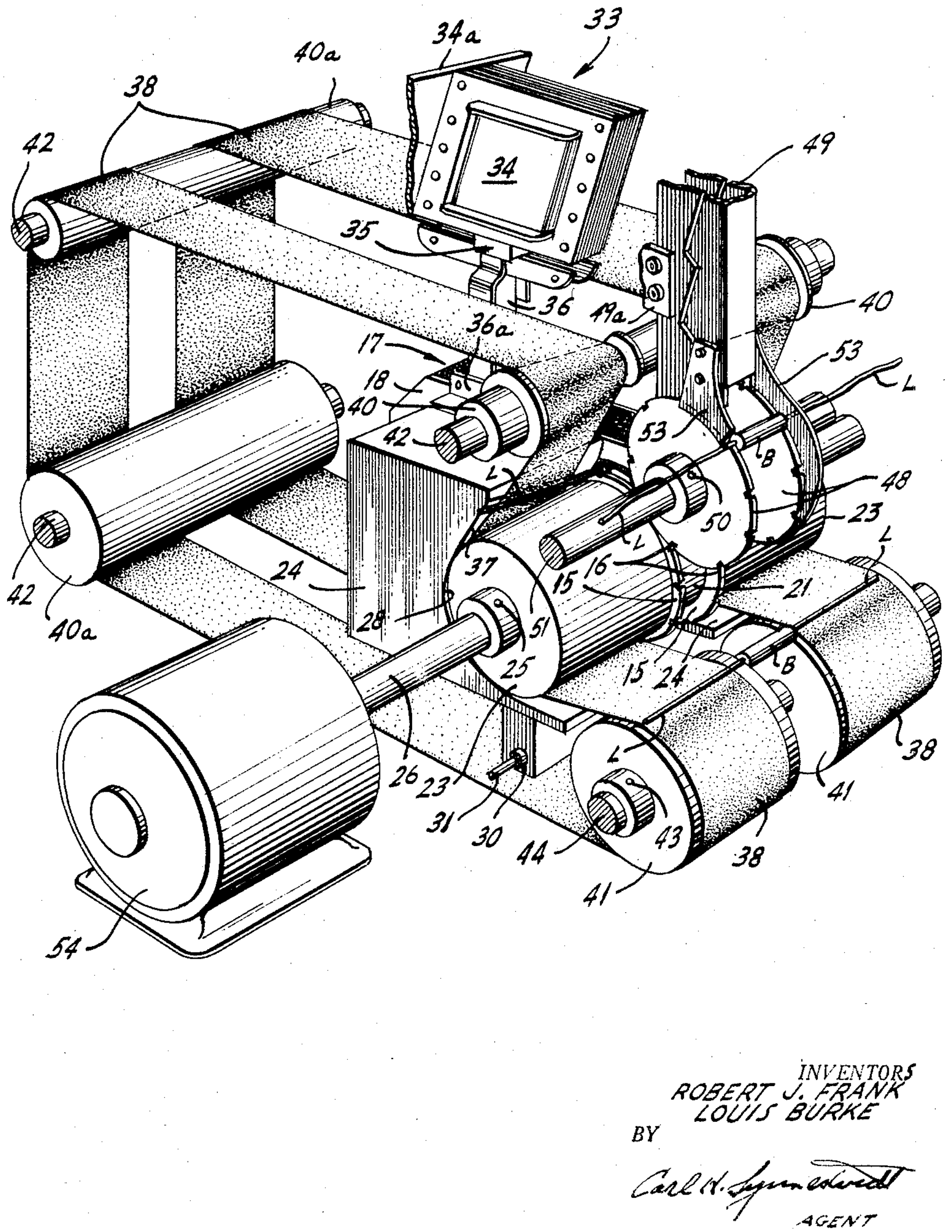
Figure 3 is a perspective view of the machine shown in Figures 1 and 2 with certain parts removed for clarity of illustration.
Figure 5:
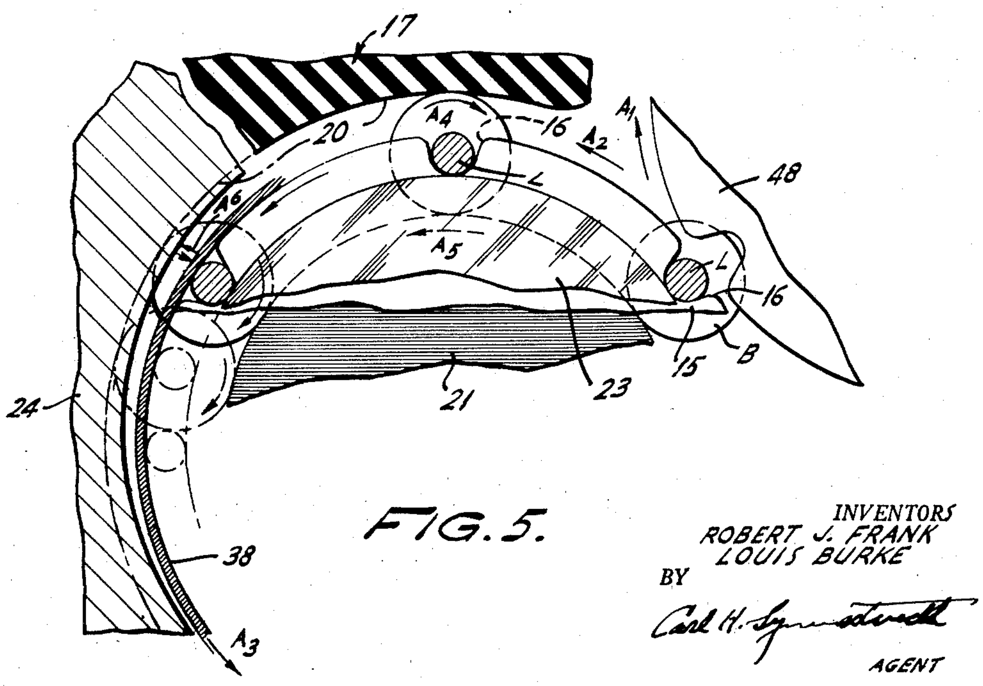
Figure 5 is an enlarged diagrammatic view illustrating the operation of certain associated parts of the machine.

The illustrated machine to be presently described is specially devised and adapted for use with electronic components which, as represented in Figures 3 and 5 of the drawings, have a cylindrical body B and elongated wire leads L extending axially from the ends of said body. However, it will be understood that a machine embodying the features of the invention is not limited to that specific application and would be useful in the handling of different kinds of articles generally similar in form to the illustrated components.

With more particular reference to the drawings, the framework of the illustrated machine comprises a table or base 10, parallel upright side members 11 mounted on said table or base, and cross-pieces 12 and 14 interconnecting said members at the top thereof. The side members conveniently take the form of generally rectangular plates disposed vertically and in positions to accommodate therebetween operable parts of the machine. Basically, these operable parts include: means for carrying or transporting the components through the machine; means for imparting rotation to components being transported through the machine; and means for applying repeated blows on the leads during rotation of components passing through the machine.

In the illustrated embodiment, the means serving to transport components through the machine, essentially includes a pair of rotatable disk-like elements 15 each of which has an equal number of shallow equidistant notches 16. These notches open at the periphery of the disk-like elements 15 which are arranged concentrically to confront each other with a space therebetween slightly greater than the length of component bodies adapted to be supported between said elements. Moreover, the elements 15 are so disposed that the notches of one of said elements are aligned with the notches of the other of said elements to engage the leads of components at places adjoining the body thereof. In this manner, a component with its body occupying the space between the disk-like elements 15 and with its leads seated within a pair of said aligned notches is carried through the machine by said elements when rotated, and a component thus carried is restrained against sliding axially in said notches but is free to rotate axially with respect to said elements.

Figure 1:
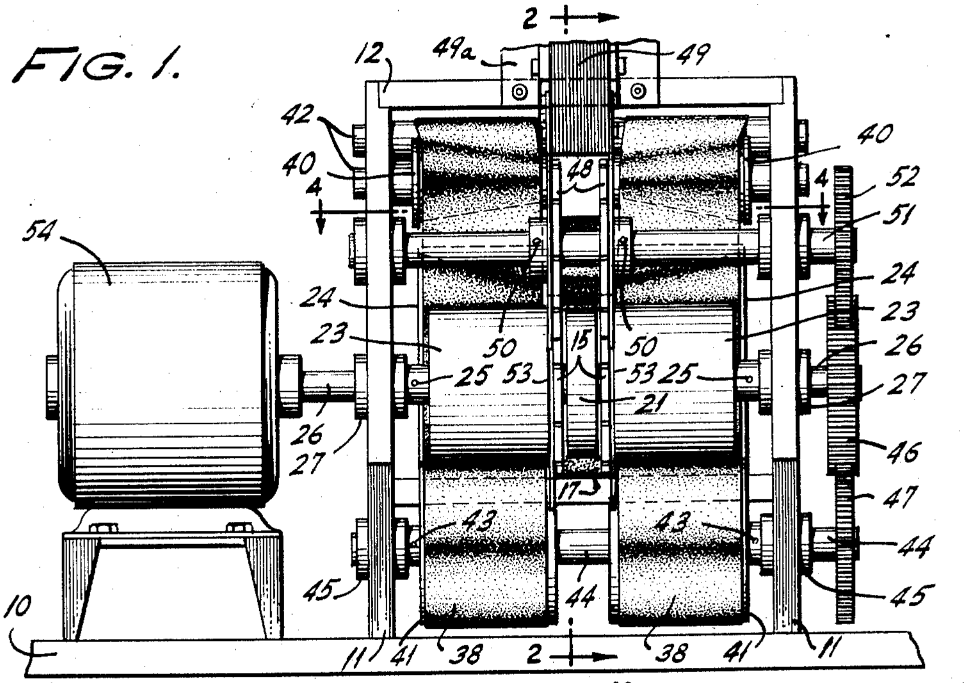
Figure 1 is a front elevational view of a component lead straightening machine constructed in accordance with the principles of the present invention.
Figure 2:
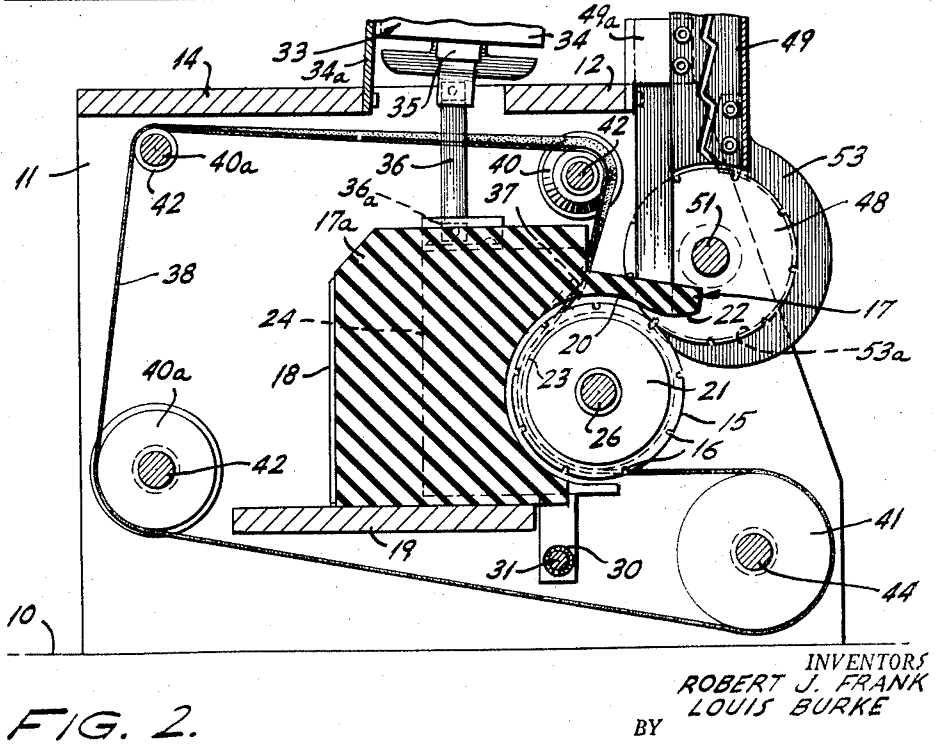
Figure 2 is a cross-sectional view taken substantially on line 2—2 of Figure 1.
Figure 4:
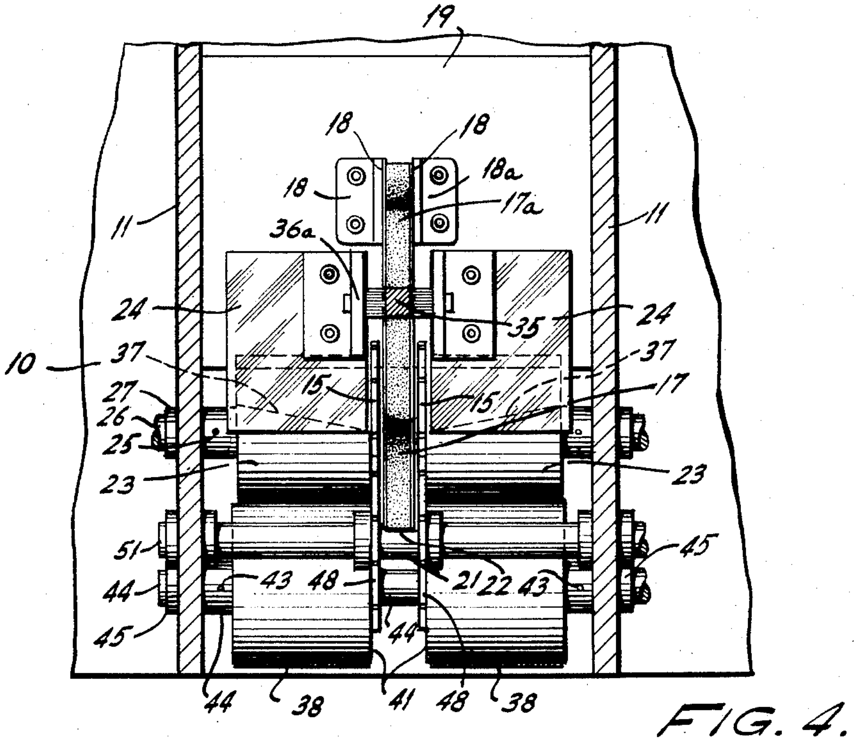
Figure 4 is a fragmentary sectional view looking in the general direction of arrows 4—4 in Figure 1.

The means serving to impart axial rotation to the components essentially comprises a snubber 17 formed from a block 17*a* of compressible material, such as rubber, which is clamped between reinforcing plates 18 fixedly mounted as by means of angle brackets 18*a* (Figure 4) on a shelf 19 spanning the upright side members 11 of the frame. The snubber has an exposed edge portion 20 which as best seen in Figure 2 is rounded on a curve substantially concentric with the disk-like elements 15, and which as best seen in Figure 4 is disposed in registry with the space between said elements to overlie and frictionally engage the body of components during part of their travel through the machine. By this arrangement, the mentioned portion 20 of the snubber imposes on said body a restraining force which acts on a travelling component to cause it to rotate axially in the notches within which the component leads are seated.

In order to prevent components from sagging when frictionally engaged by the snubber, there is provided an annular spacer 21 of rigid material on which said bodies rest. Thus, the component bodies become sandwiched between said spacer and the portion 20 of the snubber and are maintained in proper contact with said snubber. In practice, the spacer 21 is mounted for free rotation so as not to interfere with axial rotation of a component by the mentioned action of the snubber portion 20. In other words, the rolling surface provided by the rotatably mounted spacer 21 tends to eliminate frictional resistance which would normally result from engagement of component bodies with said spacer. As clearly appears in Figures 2 and 4, the edge portion 20 of the snubber 17 has an outwardly flaring extension 22 at the place where component bodies first enter between the snubber and ring. Because of this flaring extension, a component carried by the rotating carriage elements 15, is smoothly and progressively guided into proper engagement with said portion 20 of the snubber.

The means serving to subject component leads to repeated blows as said leads rotate with the body of a component, comprises cooperating anvil members 23 and hammer members 24.

In the illustrated embodiment, the anvil members 23 are formed by a pair of cylinders, one of said cylinders being located on the outside of one of the disk-like elements 15, the other of said cylinders being mounted to the outside of the other of said elements, and both cylinders being disposed concentrically with respect to said disk-like elements. These cylinders and disk-like elements are advantageously connected to rotate as a unit and for that purpose said elements are rigidly affixed to said cylinders, the latter being conveniently keyed as by means of set screws 25 to a shaft 26 which spans and extends through the upright side members 11 of the frame and which is rotatably supported in bearings 27 located in appropriate positions on said side members. In accordance with the invention, the cylinders or anvil members 23 are arranged so that their circumferential surfaces are immediately below component leads seated in the notches 16. In this manner, said cylinders or anvil members provide surfaces for supporting component leads and for cooperation with the hammer members 24 in the straightening and alignment of the leads. These hammer members are formed by a pair of solid blocks each of which, as best seen in Figure 3, has a lower portion 28 rounded on a curved concentric with the cylindrical anvil members 23, one of said blocks being disposed so that its rounded portion confronts and lies adjacent one of said anvil members, the other of said blocks being disposed so that its rounded portion confronts and lies adjacent the other of said anvil members, and both blocks being mounted for movement toward and away from said anvil members. For that purpose, the blocks are advantageously mounted by means of ball bearings 30 to swing on a rod 31 which extends between and is supported by the upright side members 11.

In particular accordance with the invention, the blocks or hammer members 24 are swingably displaced at a rapid rate of the order of twenty-five to thirty cycles per second. This rapid vibrational displacement of the hammer members is conveniently accomplished by function of a vibrator or solenoid 33 which includes a coil 34 and a reciprocating armature 35. The coil 34 is carried by a bracket 34*a* on the cros-piece 14 of the framework, and the armature 35 is pivotally anchored to the blocks or hammer members 24 through pivotal link 36 and yoke 36*a*. By this arrangement, the hammer members 24 in cooperation with the anvil members 23 straighten and align component leads by striking light but firm rapid blows on component leads against the anvil members as said leads are brought in position between said hammer and anvil members and are rotated axially in the manner hereinbefore stated.

To insure proper straightening and alignment of kinked and bent portions of component leads without subjecting the component as a whole to undue detrimental stresses, it is desirable that the pressing and hammering action utilized to straighten and align the leads be applied progressively to successive portions of the leads before such action is applied uniformly throughout the full length of the leads. For that purpose, each of the blocks or hammer members 24 has an upper surface portion 37 which slopes rearwardly from the inner edge toward the outer edge of said members. As seen in Figure 3 of the drawings, this surface portion 37 extends continuously and upwardly from the lower curved surface portion 28 so that the pressing and hammering actions of associated hammer and anvil members is first applied to a lead at a portion thereof adjacent a component body and then applied in progressive fashion to successive portions of the lead until the latter reaches said surface portion 28 whereupon said pressing and hammering actions are applied uniformly over the full length of the lead. In this manner each of the component leads is subjected to an ironing-like action which cooperates with the hereinfore described pressing and hammering actions to effect progressive smoothing out of deformed and misaligned portions of the leads as a component rotates axially in passing between the associated hammer and anvil members.

In order to prevent the axially rotating leads from being swept back by reason of contact with the non-rotatable hammer members 24, the machine is supplied with movable friction means in the form of endless belts 38 which provide moving frictional surfaces for contact with said leads during their travel between said members and the rotatable anvil members 23. These belts pass between said members, over idlers 40 and guiding rollers 40a and over driving rollers 41. The idlers and guiding rollers are freely mounted on rods 42 extending between the side members 11 of the frame and fixed thereto, and the driving rollers are affixed as by means of lock-screws 43 on a shaft 44, which spans said side members and is rotatably mounted in bearings 45. The belts 38 are driven at the same rate of speed as the rotation of the cylinders or the anvil members 23 so that component leads in engagement with the notched elements 15, are prevented from lagging behind the body of components carried through the machine by said elements. Travelling of the belts at a linear speed equal to the rotational speed of the anvil members is obtained by drivingly coupling the rotatable shafts 26 and 44, as by means of appropriately designed meshing gears 46 and 47 secured to said shafts, respectively.

In order that the belts 38 may be kept uniformly taut while travelling over the slanting portions 37 of the hammer members 24, the guiding rollers 40 which are adjacent said portions, are conically shaped and are so disposed that their periphery slants in directions opposite to slant of said portions. In this manner, the conically shaped rollers take up slack in the belts when travelling over the above mentioned portions 37 of the hammer members.

The machine, as shown in the drawings, is advantageously provided with feeding mechanism for automatically delivering components to the notched elements 15. For that purpose, a second pair of notched rotatable elements or wheels 48 are disposed to receive components from a feeding channel 49 and to transfer components to the elements 15, said channel being carried by a bracket 49a on the cross-piece 12 of the framework. As best illustrated in Figures 2 and 3, the wheels 48 are affixed as by means of lock screws 50, on a rotatable axle 51, between the side members 11 of the framework and are disposed in alignment with the elements 15. The notches in the wheels 48 are arranged to correspond in number and spacing to the notches of said elements 15, and the wheels are rotated at the same rate of speed as said elements by drivingly connecting the axle 51, by means of a suitably designed gear 52 enmeshed with the gear 46 of the shaft 26. In this manner, as seen in Figures 2 and 3, notches of the rotating elements 15 and wheels 48 meet at one point in the path of rotation of said elements and wheels so that leads of components pass from said wheels to said elements to be thereby carried through the machine.

Retaining fingers 53 having curved edges 53a (see Figure 2) are mounted on the feeding channel 49 to extend adjacent the periphery of the wheels 48 and to overlie component leads seated in notches thereof, thereby preventing disengagement of components being transported from said channel to the carriage elements 15. Components emerging from between the straightening and aligning members of the machine drop out of the notches of the elements 15 and on the endless belts 38 to ride with said belts and be thereby discharged from the machine, as is represented in Figure 3. A motor 54 is conveniently coupled to the shaft 26 to drive the cylindrical anvil members 23, said shaft in turn driving the belt rollers 41 and the wheels 48 through the above stated connections.

In operation of the machine illustrated in the drawings, it will be better understood by referring to diagrammatic Figure 5. As seen in this figure, the transfer or feeding wheel 48 rotates in clockwise direction as represented by arrow $A_1$; the notched elements 15 and anvil members 23 rotate together in counterclockwise direction as represented by arrow $A_2$; and the belts 38 passing over the hammering surface of members 24 travel in the direction represented by arrow $A_3$, that is to say, in the same general direction as the direction of rotation of the elements 15 and members 23. With this arrangement, components transferred from the wheels 48 to the elements 15 move in counterclockwise direction with said element and with the anvil members 23. However, upon engagement with the portion 20 of the snubber 17, components are caused to rotate axially in clockwise direction as represented by arrow $A_4$ in said Figure 5. As each component advances through the machine and rotates in the notches 16 of the carriage elements 15, the hammer members 23 swing as represented by arrows $A_6$ to strike the component leads, the belts 38 serving to prevent said leads from being swept back with respect to the component body. By effecting movement of the components and of the mentioned machine parts in the manner above described, the machine operates to straighten and axially align component leads without subjecting them to twisting or other undesirable stresses.

While the invention has been shown and described with respect to what is presently considered a preferred embodiment, it will be recognized that modifications may be made in the specified structural details without departing from the gist of the invention. Particularly, it will be appreciated that the dimension of and spacing between the various associated elements cooperating to straighten and align the leads, may vary to suit and accommodate components of different sizes. Accordingly, it is to be understood that the subjoined claims are intended to cover those changes and modifications which come within the true spirit and scope of the invention as set forth in said claims.

We claim:

1. A machine for straightening and aligning elongated wire leads extending axially from opposite ends of cylindrical component bodies, comprising a carriage structure for moving said bodies together with their leads through the machine, said carriage structure including a pair of relatively spaced rotatable disc-like elements each having means for engaging a wire lead of a cylindrical component body, anvil means for providing a supporting surface for said wire leads, said anvil means consisting of a pair of cylinders rotatable with said elements, hammer means mounted to confront said anvil means and to move with respect thereto for striking repeated blows on said wire leads against said anvil means, said hammer means including a pair of blocks having surface portions overlying part of said cylinders, and means for frictionally engaging said bodies to impart axial rotation thereto and to said wire leads while being struck, said last mentioned means being provided by a snubber of compressible material having an edge portion disposed to bear upon said component bodies.

2. A machine for straightening and aligning elongated wire leads extending axially from opposite ends of cylindrical component bodies, comprising axially spaced rotatable disc-like elements having means for engaging component wire leads of a component body to advance the component through the machine, a snubber of compressible material having an edge disposed for frictional engagement with said body to impart axial rotation thereto and to said leads as the component advances with said elements, cylinders of rigid material connected to said elements to rotate therewith and providing a solid supporting surface for said leads, blocks of rigid material providing a solid surface overlying parts of said cylinders and operable for striking repeated blows on said leads adjacent said supporting surfaces, means for operating said blocks, and feeding mechanism for delivering components to said elements.

3. A machine as set forth in claim 2, in which means is provided for driving the mentioned elements and feeding mechanism at a uniform rate of speed.

4. A machine as set forth in claim 2, in which the mentioned means of each of the mentioned disc-like elements is provided by notches opening at the periphery of said elements, the latter being disposed in a position wherein said notches engage the wire leads of a component adjacent the ends thereof.

5. A machine as set forth in claim 2, in which the means of each of the mentioned rotatable elements is provided by notches opening at the periphery of said elements, and in which the mentioned feeding mechanism includes rotatable wheels having notches opening at the periphery of said wheels to engage leads of components to be fed to said elements, said notches of said elements and wheels being arranged to register at one point in the rotation of said elements and wheels.

6. A machine for straightening and aligning elongated wire portions extending axially from cylindrical bodies, comprising carriage instrumentalities for moving said bodies with their wire portions through the machine, anvil means for providing a supporting surface for said wire portions, hammer means mounted to confront said anvil means and to move with respect thereto for striking repeated blows on said wire portions against said anvil means, stationary friction means disposed to overlie said bodies and engageable therewith to impart axial rotation to said bodies and wire portions, and movable friction means disposed between said anvil means and said hammer means and engageable with said wire portions to prevent the latter from being swept back with respect to said bodies.

7. A machine as set forth in claim 6, in which means is provided for moving the mentioned instrumentalities and the mentioned movable friction means at uniform rate of speed.

8. A machine as set forth in claim 6, in which feeding mechanism is provided for delivering components to said elements, and in which means interconnect the mentioned carriage instrumentalities with said mechanism and with the mentioned movable friction means to drive said instrumentalities together with said mechanism and means at a uniform rate of speed.

9. A machine as set forth in claim 6, in which the mentioned movable friction means is in the form of endless belts passing between the mentioned anvil means and hammer means.

10. A machine as set forth in claim 6, in which the mentioned hammer means includes blocks of solid material constructed and arranged for smoothing out the wire portions progressively from the mentioned bodies.

11. A machine as set forth in claim 6, in which the mentioned hammer means includes blocks of solid material having slanted surface portions for progressively smoothing out the wire portions as the mentioned bodies are moved by the mentioned carriage instrumentalities, in which the mentioned movable friction means is in the form of endless belts passing over said surface portions of said blocks, and in which guide rollers for said belts are provided with surface portions slanting in a direction opposite to the slant of said surface portions of said blocks to maintain said belts in taut condition.

12. A machine for straightening and aligning elongated wire portions extending axially from cylindrical bodies, comprising carriage means for moving said bodies with their wire portions through the machine, anvil means for providing a supporting surface for said wire portions, hammer means mounted to confront said anvil means and to move with respect thereto for striking repeated blows on said wire portions against said anvil means, means disposed in the path of movement of said bodies and engageable therewith to impart axial rotation to said bodies and wire portions, and mechanism for preventing said wire portions from being swept back with respect to said bodies, said mechanism including means engageable with said wire portions to impel the same in their movement between said anvil means and said hammer means.

References Cited in the file of this patent

UNITED STATES PATENTS

| | | |
|---|---|---|
| 191,085 | Thompson et al. | May 22, 1877 |
| 2,771,206 | Daniels et al. | Nov. 20, 1956 |